US009250274B2

United States Patent
Hayes et al.

(10) Patent No.: US 9,250,274 B2
(45) Date of Patent: Feb. 2, 2016

(54) POWER ANALYSIS MODULE FOR MONITORING AN ELECTRICAL POWER SOURCE

(75) Inventors: John Hayes, Hardwick, NJ (US); Vladimir Miloslavskiy, Parsippany, NJ (US)

(73) Assignee: ASCO Power Technologies, L.P., Florham Park, NJ (US)

(*) Notice: Subject to any disclaimer, the term of this patent is extended or adjusted under 35 U.S.C. 154(b) by 774 days.

(21) Appl. No.: 13/362,701

(22) Filed: Jan. 31, 2012

(65) Prior Publication Data

US 2013/0049470 A1     Feb. 28, 2013

Related U.S. Application Data

(60) Provisional application No. 61/527,395, filed on Aug. 25, 2011.

(51) Int. Cl.
*G01R 19/00* (2006.01)
*H02J 9/00* (2006.01)
*G01R 19/175* (2006.01)
(Continued)

(52) U.S. Cl.
CPC .............. *G01R 19/175* (2013.01); *G01R 19/00* (2013.01); *H02J 9/06* (2013.01); *H02J 13/00* (2013.01); *Y02B 90/222* (2013.01); *Y04S 20/12* (2013.01); *Y10T 307/615* (2015.04)

(58) Field of Classification Search
CPC .................................. H02J 9/06; G01R 19/00
USPC .................................................... 307/64, 112
See application file for complete search history.

(56) References Cited

U.S. PATENT DOCUMENTS

| 4,525,874 A | * | 6/1985 | Baues ............................ 398/168 |
| 5,739,594 A | * | 4/1998 | Sheppard et al. ................ 307/64 |
| 5,959,448 A | | 9/1999 | Baranski et al. |

(Continued)

FOREIGN PATENT DOCUMENTS

| CN | 201368896 Y | 12/2009 |
| CN | 201527447 U | 7/2010 |

(Continued)

OTHER PUBLICATIONS

First Office Action regarding Chinese Patent Application No. 2012101192940, dated Sep. 4, 2014. Translation provided by Unitalen Attorneys at Law.

(Continued)

*Primary Examiner* — Adi Amrany
(74) *Attorney, Agent, or Firm* — Harness, Dickey & Pierce, P.L.C.

(57) ABSTRACT

A method of analyzing the characteristics of a power source includes receiving a power source having at least one phase and sensing voltage signals of each phase of the at least one phase. The method includes detecting a zero crossing event of a selected phase of the at least one phase based on the sensed voltage signals of the selected phase. The method also includes determining, using a processor, voltage information for each phase of the at least one phase based on the corresponding sensed voltage signals. The method further includes outputting a series of pulses via a galvanic isolator in response to the zero crossing event. Respective lengths of some or all of the pulses in the series are based on the corresponding voltage information for each of the at least one phase.

24 Claims, 8 Drawing Sheets

(51) Int. Cl.
*H02J 9/06* (2006.01)
*H02J 13/00* (2006.01)

(56) References Cited

U.S. PATENT DOCUMENTS

| | | | |
|---|---|---|---|
| 6,330,176 B1 * | 12/2001 | Thrap et al. | 363/142 |
| 6,542,023 B1 * | 4/2003 | Daun-Lindberg et al. | 327/460 |
| 6,630,753 B2 * | 10/2003 | Malik et al. | 307/64 |
| 6,734,784 B1 * | 5/2004 | Lester | 340/12.33 |
| 7,334,735 B1 * | 2/2008 | Antebi et al. | 235/492 |
| 7,495,356 B2 * | 2/2009 | Kuo | 307/64 |
| 7,688,780 B2 * | 3/2010 | Rensberger et al. | 370/328 |
| 7,696,743 B2 | 4/2010 | Tajima et al. | |
| 7,835,649 B2 * | 11/2010 | Epps et al. | 398/155 |
| 7,856,520 B2 * | 12/2010 | Ranade et al. | 710/106 |
| 8,004,115 B2 * | 8/2011 | Chapel et al. | 307/64 |
| 8,174,149 B2 * | 5/2012 | Chapel et al. | 307/64 |
| 8,232,680 B2 * | 7/2012 | DiMarco et al. | 307/85 |
| 2006/0226958 A1 * | 10/2006 | Baril et al. | 340/310.11 |
| 2008/0278295 A1 * | 11/2008 | McKenzie et al. | 340/310.11 |
| 2009/0289618 A1 | 11/2009 | Tajima et al. | |
| 2013/0093249 A1 * | 4/2013 | Chapel et al. | 307/80 |

FOREIGN PATENT DOCUMENTS

| | | |
|---|---|---|
| CN | 101854063 A | 10/2010 |
| CN | 102075001 A | 5/2011 |
| CN | 201846243 U | 5/2011 |
| CN | 102081116 A | 6/2011 |
| DE | 4309792 A1 | 9/1994 |
| JP | 4419882 B2 | 2/2010 |
| WO | WO-2008026276 A1 | 3/2008 |

OTHER PUBLICATIONS

Yong-feng Liu et al. "Design of dual sources automatic transfer switches controller based on ATmega16." Relay. vol. 34, No. 23. Dec. 1, 2006. Translation provided by Unitalen Attorneys at Law.

* cited by examiner

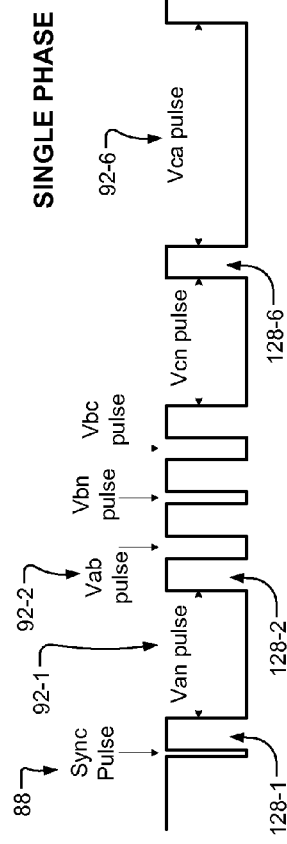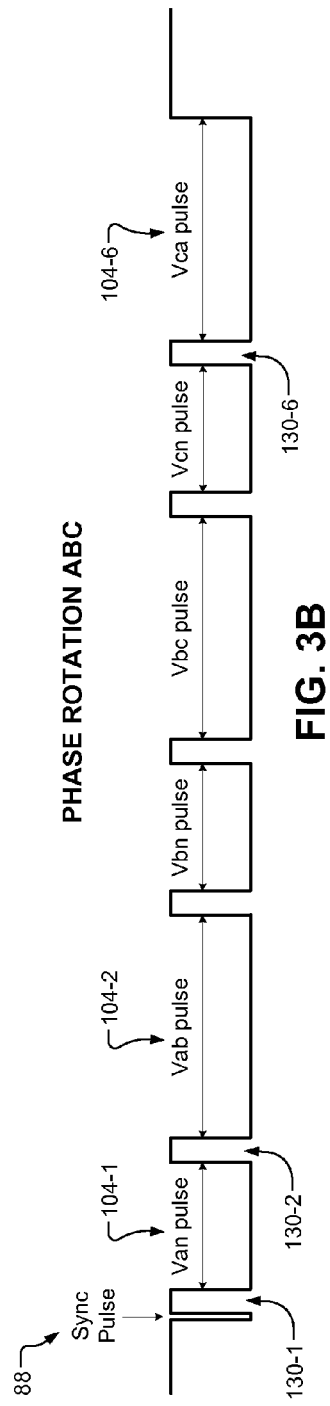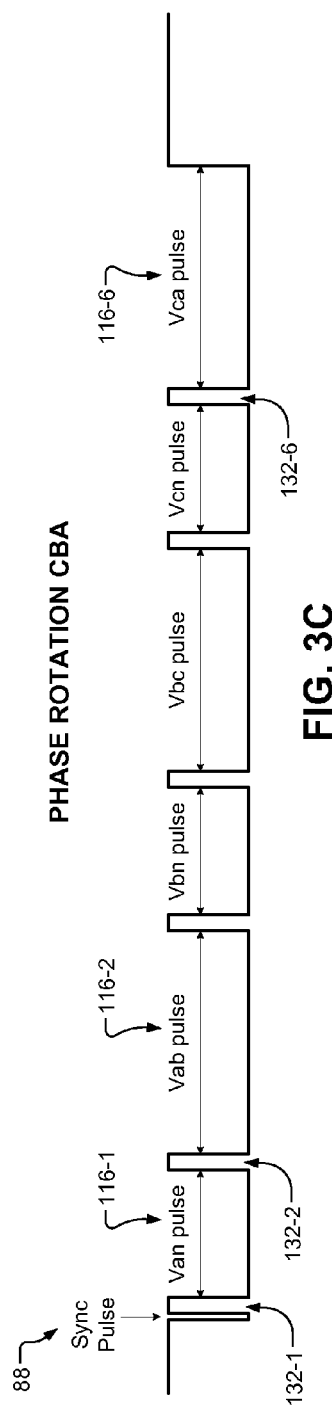

POWER ANALYSIS MODULE FOR MONITORING AN ELECTRICAL POWER SOURCE

CROSS-REFERENCE TO RELATED APPLICATIONS

The present application claims priority to U.S. Patent Application No. 61/527,395, filed on Aug. 25, 2011, the entire disclosure of which is incorporated herein by reference.

FIELD

The present disclosure relates to a power analysis module for monitoring an electrical power source.

BACKGROUND

This section provides background information related to the present disclosure and is not necessarily prior art.

Various applications require a nearly constant supply of reliable electrical power to operate effectively. For example, hospitals require a constant and reliable supply of electricity to ensure medical equipment in operating rooms and the like function when needed. Further, food retailers such as supermarkets and grocery stores require a constant and reliable supply of electricity to properly operate refrigeration systems associated with display cases and freezers to prevent food spoilage.

While utility companies are generally the primary source of consistent and reliable electrical power, such power is sometimes interrupted due to inclement weather, unforeseen accidents, or maintenance. Interruptions in power, while irritating and unpleasant, are often tolerable by the general public. Institutions such as hospitals and businesses such as food retailers, on the other hand, cannot afford even minor interruptions in their power supply.

Consequently, electrical power consumers that cannot afford even minor interruptions in their power supply often rely on generators and other backup systems to supply electrical power during periods when electrical service from a utility company is interrupted. Transfer switches enable these consumers to switch between a primary electrical source (i.e., from a utility company) and a secondary electrical source (i.e., a generator or other backup system) when one source becomes unreliable or requires maintenance.

SUMMARY

This section provides a general summary of the disclosure, and is not a comprehensive of its full scope or all of its features.

A method of analyzing the characteristics of a power source includes receiving a power source having at least one phase and sensing voltage signals of each phase of the at least one phase. The method includes detecting a zero crossing event of a selected phase of the at least one phase based on the sensed voltage signals of the selected phase. The method also includes determining, using a processor, voltage information for each phase of the at least one phase based on the corresponding sensed voltage signals. The method further includes outputting a series of pulses via a galvanic isolator in response to the zero crossing event. Respective lengths of some or all of the pulses in the series are based on the corresponding voltage information for each of the at least one phase.

The method may further include receiving the power source and a second power source in an automatic transfer switch; receiving the series of pulses from the galvanic isolator; based on the received series of pulses, selecting one of the power source and the second power source; and connecting the selected power source to a load.

Some implementations of the method include a power source that has three phases and determining a phase rotation of the three phases. The method may include selecting a predetermined spacing based on the phase rotation and outputting the series of pulses with the predetermined spacing between at least two pulses of the series. In some arrangements, the series of pulses includes (i) a sync pulse representative of the zero crossing event and (ii) for each of the at least one phase, at least one voltage pulse representative of corresponding voltage information. Further, beginning the output of the sync pulse may occur approximately simultaneously with the zero crossing events and the sync pulse may be an initial pulse of the series of pulses. Where three phases are present, outputting the series of pulses may include outputting a voltage pulse corresponding to each of the three phases.

In some implementations, the voltage signals for a first phase of the at least one phase include instantaneous voltage readings and determining the voltage information for the first phase includes detecting a peak value of the instantaneous voltage readings. Determining the voltage information for the first phase may further include calculating a statistical parameter of the first phase based on the instantaneous voltage readings. The statistical parameter may include at least one of a mean value, a root mean value, and a root mean squared value.

Determining the voltage information for each of the at least one phase may include determining at least one of a line-to-line voltage, a line-to-neutral voltage, a square of the line-to-line voltage, a square of the line-to-neutral voltage, a mean of the line-to-line voltage, a mean of the line-to-neutral voltage, a root mean square of the line-to-line voltage, and a root mean square of the line-to-neutral voltage.

Determining the voltage information and outputting the series of pulses may further include determining, for each one of the at least one phase: a first voltage parameter representing a line-to-neutral voltage and a second voltage parameter representing a line-to-line voltage; a mean of at least one of the first and second voltage parameters; and a root mean square of at least one of the first and second voltage parameters; and the series of pulses includes (i) a sync pulse corresponding to the zero crossing event and (ii) for each of the at least one phase, a voltage pulse representative of the root mean square. Where three phases are present, the method may include determining a phase rotation of the three phases; selecting a predetermined spacing based on the phase rotation; and outputting the series of pulses with the predetermined spacing between at least two of the pulses in the series. In this implementation, the series of pulses may be outputted such that the sync pulse is an initial pulse of the series of pulses, the beginning of the sync pulse is approximately simultaneous with the zero crossing event, and each of the voltage pulses is separated by the predetermined spacing.

A power analysis module receiving a power source having at least one phase is also disclosed. The power analysis module includes a sensing module that senses voltage signals of the at least one phase; a zero crossing module that detects a zero crossing event of a selected phase of the at least one phase based on the sensed voltage signals of the selected phase; a processing module that determines voltage information for each of the at least one phase based on the sensed voltage signals of the at least one phase; and an output module that outputs a series of pulses in response to the zero crossing event to a galvanic isolator, wherein lengths of some or all of the pulses in the series are based on the voltage information for each of the at least one phase. The power analysis module may sense the power source of an automatic transfer switch.

The lengths of the series of pulses may be proportional to the voltage information and/or the length of an initial pulse of the series may be a fixed predetermined length.

The power analysis module may monitor a three phase power source and may determine the phase rotation of the three phases, select a predetermined spacing based on the phase rotation; and the output module may outputs the series of pulses with the predetermined spacing between at least two pulses of the series of pulses. Further, the power analysis module may be implemented on a processor and the zero crossing module may comprise a comparator that detects the zero crossing event of the selected phase. The comparator may be external to the processor.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only and are not intended to limit the scope of the present disclosure.

FIGS. 3A-3C are schematic representations of series of pulses generated by a power analysis module in accordance with the principles of the present disclosure;

Corresponding reference numerals indicate corresponding parts throughout the several views of the drawings.

DETAILED DESCRIPTION

Figure 1:
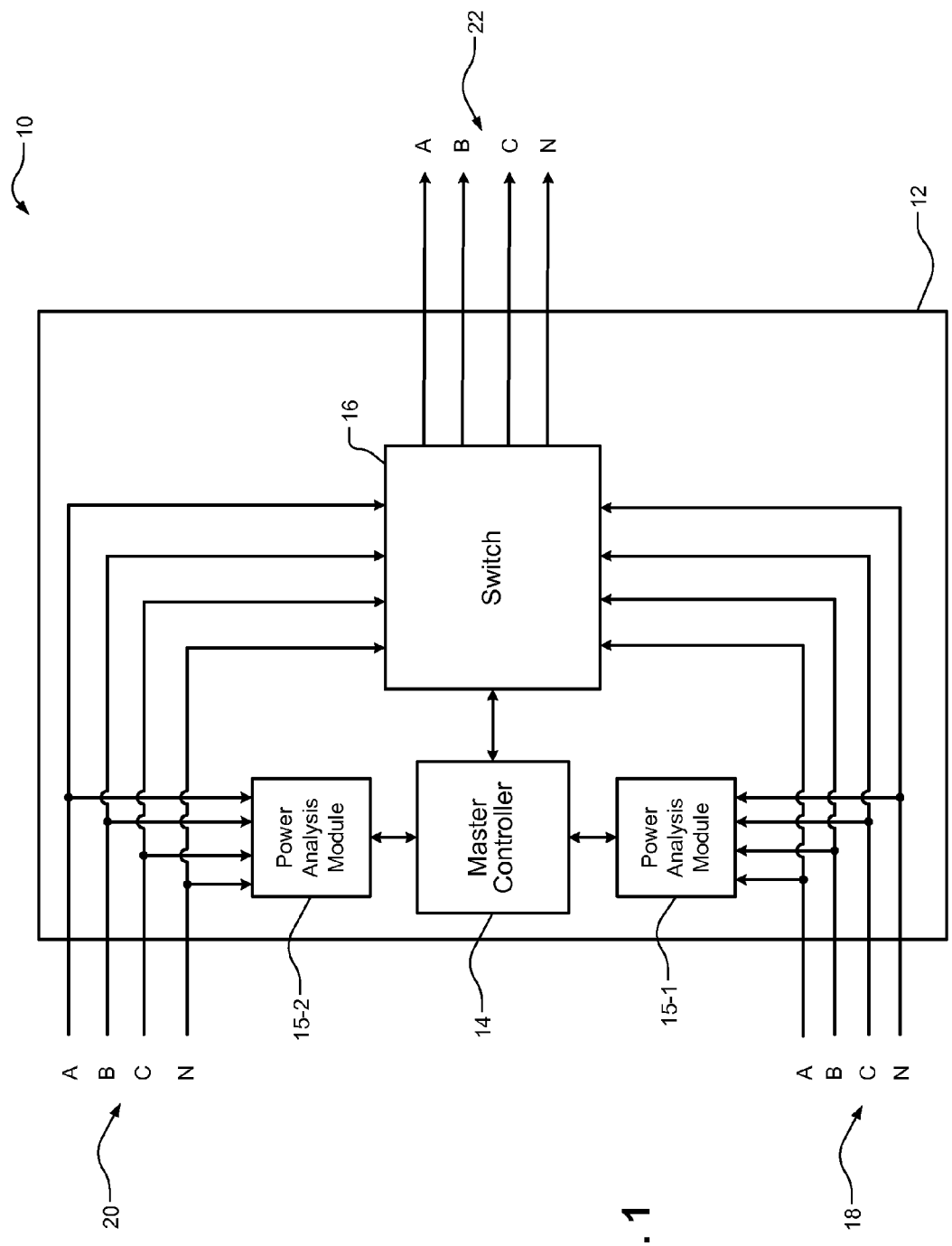
FIG. 1 is a functional block diagram of a transfer switch device.

An automatic transfer switch electrically connects one of multiple power supplies to a load—such as when switching power to the load from a malfunctioning utility power to a backup power supply. A master controller of the automatic transfer switch may determine which of the power supplies to use based on measurements of each of the power supplies provided to it by corresponding power analysis modules. Referring to an example implementation of one of these power analysis modules, the power analysis module senses voltage signals of the corresponding power supply. Based on the voltage signals, the power analysis module calculates voltage information, and transmits this information to the master controller via a galvanic isolator.

The power analysis module represents the voltage information using a sequence of binary pulses. The duration of each of the pulses corresponds to an item of the voltage information. The items of voltage information include the RMS (root mean square) phase to neutral voltage for each phase as well as the RMS phase to phase voltage between each pair of phases. The power analysis module uses spaces with predetermined lengths between the pulses to convey whether the power supply is a multiphase power supply and, if so, the phase rotation of the power supply. The order in which the sequence of pulses is arranged and the predetermined lengths of the spaces is known to the master controller such that the master controller may determine the corresponding voltage and phase information. The sequence of binary pulses is transmitted once per cycle of the power supply, and the transmission is therefore shorter than one cycle of the power supply. The beginning of transmission of the sequence is synchronized with zero crossings (in either the positive or negative direction) of a selected phase of the power supply.

Example implementations are provided so that this disclosure will be thorough, and will fully convey the scope to those who are skilled in the art. Numerous specific details are set forth such as examples of specific components, devices, and methods, to provide a thorough understanding of the present disclosure. It will be apparent to those skilled in the art that specific details need not be employed, that example arrangements may be embodied in many different forms, and that neither should be construed to limit the scope of the disclosure. In some example arrangements, well-known processes, well-known device structures, and well-known technologies are not described in detail.

When an element or layer is referred to as being "connected to" or "coupled to" another element or layer, it may be directly on, engaged, connected, or coupled to the other element or layer, or intervening elements or layers may be present. As used herein, the term "and/or" includes any and all combinations of one or more of the associated listed items.

Although the terms first, second, third, etc. may be used herein to describe various elements, components, regions, layers, and/or sections, these elements, components, regions, layers, and/or sections should not be limited by these terms. These terms may simply be used to distinguish one element, component, region, layer or section from another component, region, layer or section. Terms such as "first," "second," and other numerical terms when used herein do not imply a sequence or order unless clearly indicated by the context. Thus, a first element, component, region, layer, or section discussed below could be termed a second element, component, region, layer, or section without departing from the teachings of the example.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors or a group of execution engines. For example, multiple cores and/or multiple threads of a processor may be considered to be execution engines. In various implementations, execution engines may be grouped across a processor, across multiple processors, and across processors in multiple locations, such as multiple servers in a parallel processing arrangement. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

FIG. 1 illustrates a transfer switch 10 that selectively supplies power to a load 22 from a primary electrical power source 18 and a secondary electrical power source 20 (collectively, the power sources 18, 20). The transfer switch 10 includes a master controller 14, two power analysis modules 15-1 and 15-2, and a switch 16. Some or all of these components may be housed in a housing 12. In various implementations, a single module may perform the functions of both of the power analysis modules 15-1 and 15-2. Further, one or both of the power analysis modules 15-1 and 15-2 may be implemented by the master controller 14.

The power analysis module 15-1 receives the primary electrical power source 18 and the power analysis module 15-2 receives the secondary electrical power source 20. Each of the power analysis modules 15-1 and 15-2 may perform similar functions—the techniques used for one of the power analysis modules 15-1 or 15-2 may apply to the other. For this reason, the remaining description refers to a power analysis module 15, which can be used for either or both of the power analysis module 15-1 and the power analysis module 15-2.

Furthermore, the power analysis module 15 is not limited to monitoring the multiple power sources received into an automatic transfer switch. In fact, the power analysis module 15 may be used to monitor the voltage characteristics of a single power source or multiple power sources, independent of the transfer switch, where galvanic isolation is preferred between the sources or between a source and a device receiving information from the power analysis module 15.

The switch 16 selectively connects the power sources 18, 20 to the load 22. While the power sources 18, 20 and the load 22 are shown as three-phase, four-pole connections, other configurations can be used for one or more of the connections. For example, the neutral conductor may be omitted on one or more of the connections. Further, single-phase connections can be used consistent with the principles of the present disclosure.

The power sources 18, 20 include one or more electrical conductors that carry electrical charge to the load 22. Each electrical conductor may have a phase designation as a convention to distinguish it from another electrical conductor. The power sources 18, 20 may be configured as single-phase and/or polyphase sources. For a single-phase source, the single phase may be referred to as "Phase A." As used herein, the use of terms "Phase", "Phase A", "Phase B", and "Phase C" as a convention to designate electrical conductors in single-phase or polyphase systems is for illustrative purposes only; the conductors could be re-labeled as long as the power analysis module 15 and the master controller 14 have a consistent interpretation of the phases.

In the below description, the phase whose zero-crossing events are sensed by the power analysis module 15 and used to synchronize transmission of the pulse series is referred to as Phase A. Again, the selected Phase A can be chosen from any of the electrical conductors. In systems that include a neutral conductor, the load 22 may be connected between two electrical conductors (line-to-line) or between one electrical conductor and the neutral conductor (line-to-neutral).

The electrical power transmitted by the power sources 18, 20 includes alternating current voltage signals. In a single-phase system, the conductors carry a single voltage signal. In a three-phase system, three conductors may carry three separate voltage signals of the same frequency. These signals reach their instantaneous peak values at different times. Using one of the signals as a reference signal, the other two voltage signals are delayed in time from the reference signal—the second signal is delayed by one-third of a cycle from the reference signal and the third voltage signal is delayed by two-thirds of the cycle.

The master controller 14 supervises and controls the switch 16 and/or the power analysis module 15 and may make a decision to switch the load 22 between power sources 18, 20 based on the output of the power analysis module 15. The master controller 14 may include logic that allows it to interpret voltage information and phase rotation of the power sources 18, 20 from series of pulses received from the power analysis module 15. Based on an interpretation of the series of pulses and an understanding of the power requirements of the load 22, the master controller 14 may make a decision to switch the load 22 between power sources 18, 20.

Furthermore, the master controller 14 may provide information to a user interface, such as a display, regarding the performance of the switch 16 and/or the power sources 18, 20. The master controller 14 employs various forms of communication to communicate with the switch 16 and/or the power analysis module 15 including, but not limited to, wired, wireless, optical, and infrared communication. While FIG. 1 illustrates master controller 14 located within the housing 12, the master controller 14 may be located remotely from the housing 12 in some arrangements.

Figure 2A:
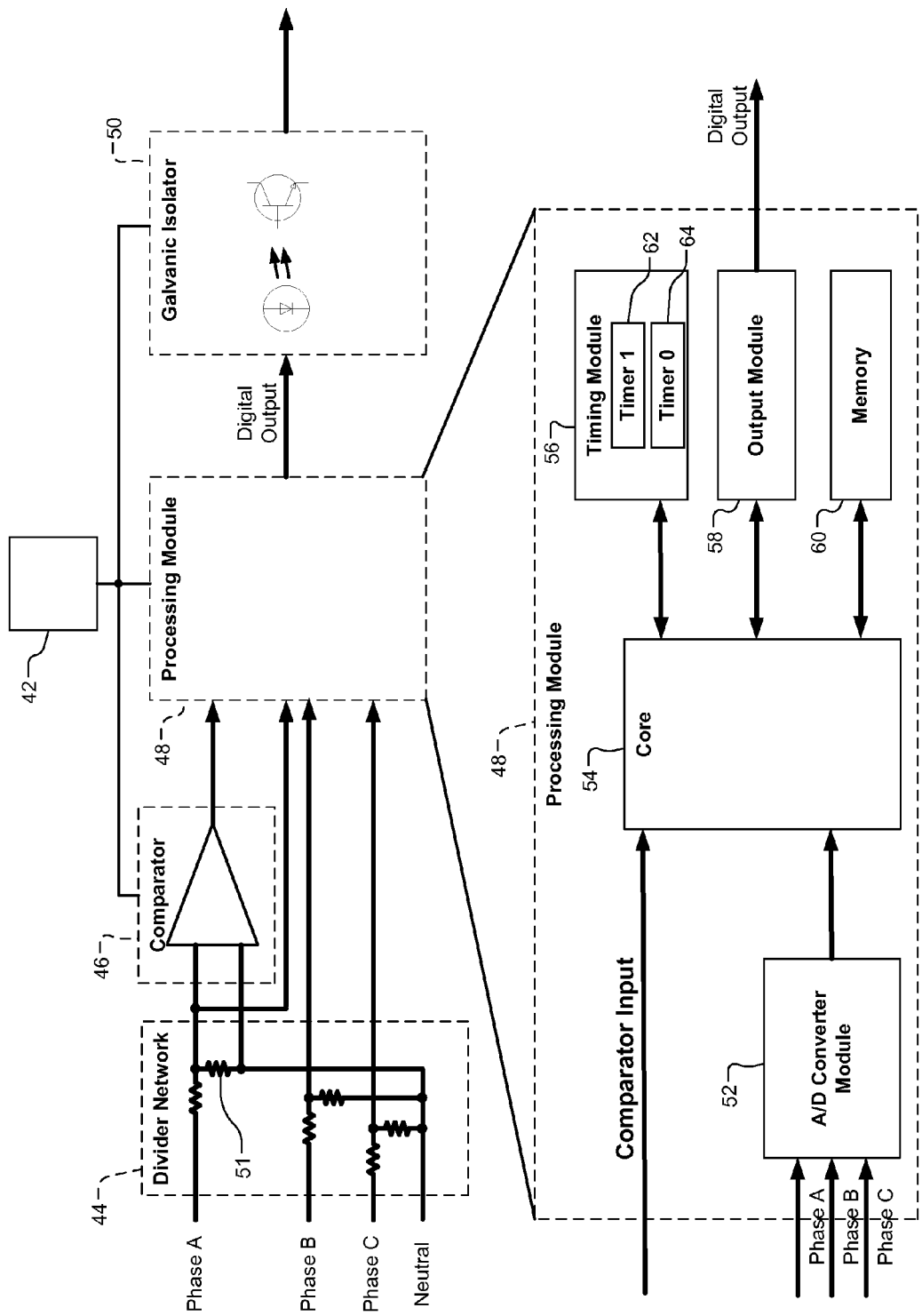
FIG. 2A is a functional block diagram of a power analysis module in accordance with the principles of the present.
Figure 2B:
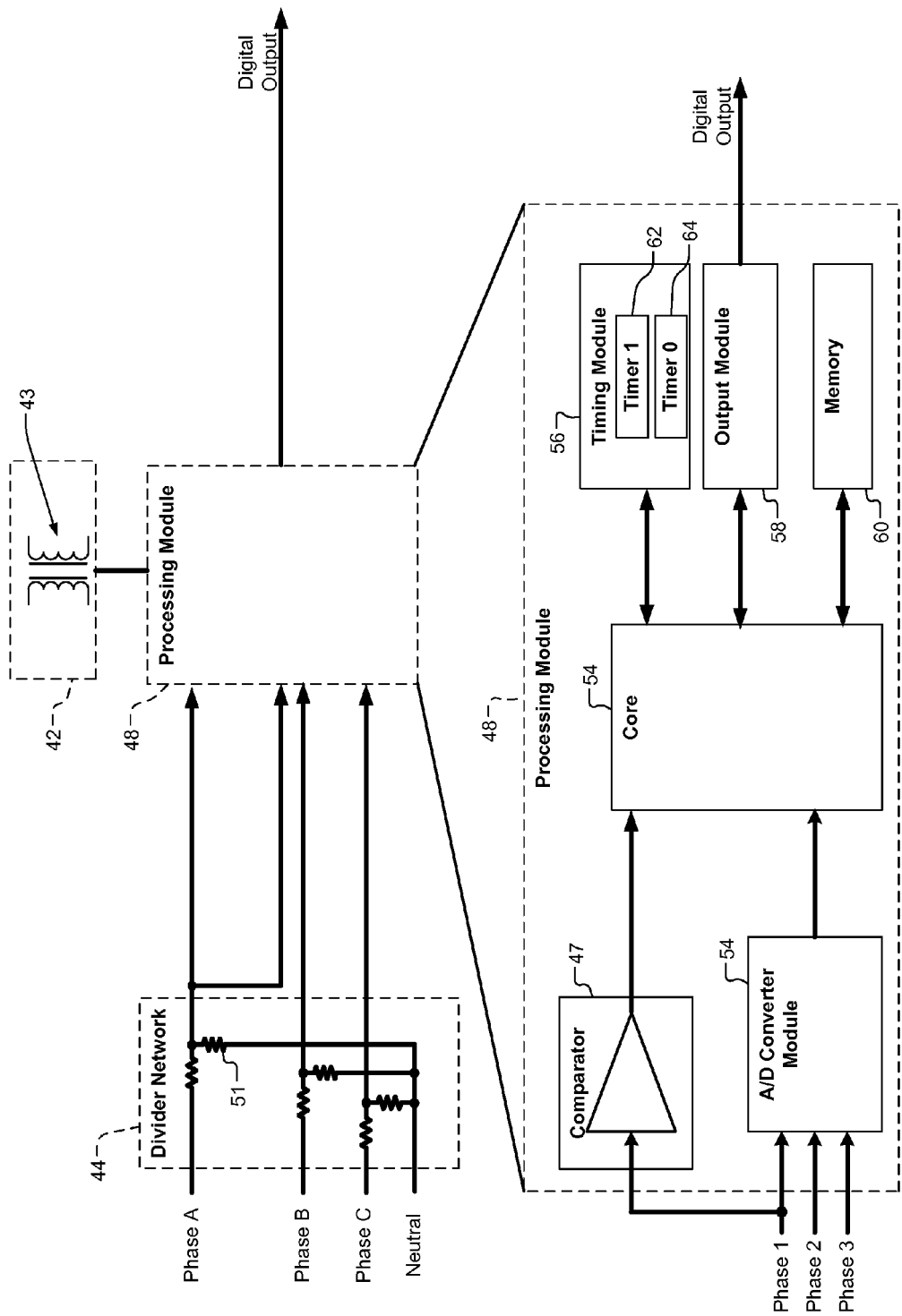
FIG. 2B is a functional block diagram of another power analysis module in accordance with the principles of the present.
Figure 2C:
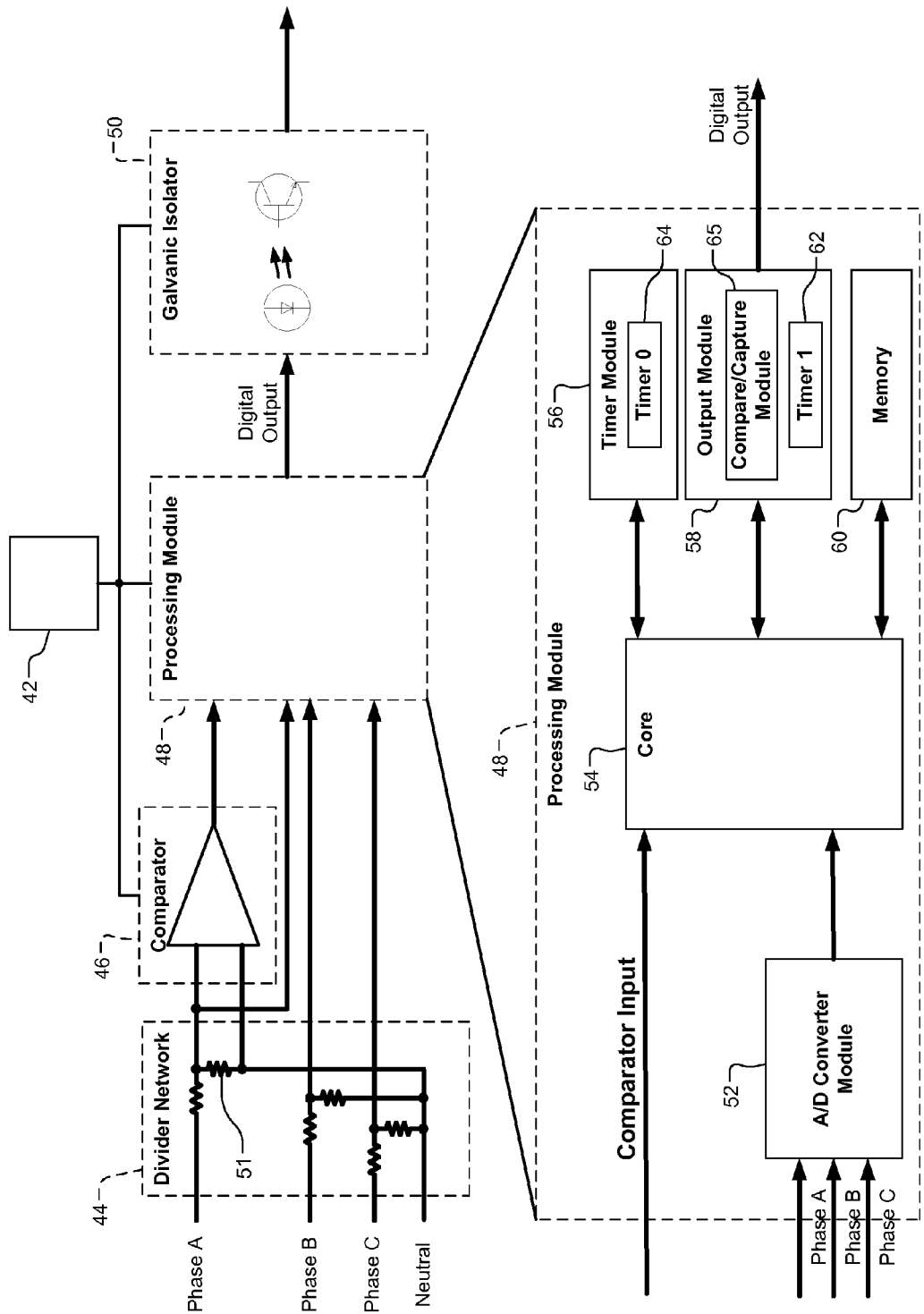
FIG. 2C is a functional block diagram of another power analysis module in accordance with the principles of the present disclosure.

FIG. 2A is an example implementation of the power analysis module 15, which receives one of the power sources 18, 20. For ease of explanation, the power analysis module 15 will be described below as receiving the power source 18. FIG. 2B is another arrangement of the power analysis module 15. Among other functions, the power analysis module 15 may (i) convert analog voltage signals to digital values, (ii) determine voltage information, (iii) determine pulse lengths that represent voltage information, (iv) determine the phase rotation and the predetermined space that represents the phase rotation, (v) compile and arrange the pulses and predetermined spaces in a series, (vi) and output the series to the master controller 14. While FIGS. 2A, 2B, and 2C illustrate three arrangements of the power analysis module 15, the power analysis module 15 may include any suitable combination of: a power supply 42, a divider network 44, a comparator 46, a processing module 48, and/or a galvanic isolator 50. The power supply 42 supplies power to the comparator 46, the processing module 48. and/or the galvanic isolator 50. The power supply 42 may include, but is not limited to, a battery, solar cell, transformer, and/or AC power supply.

Referring to FIG. 2A, the divider network 44 receives each phase of the power source 18 and reduces the voltage of each phase to an operating voltage of the power analysis module 15. The divider network 44 may include a plurality of resistors 51 and/or transformers (not shown). The number and arrangement of the resistors 51 and/or transformers in the divider network 44 may be chosen to meet the voltage and/or power requirements of the power analysis module 15. Each of the phases may be similarly processed by the divider network 44.

The comparator 46 identifies zero crossing events of Phase A and signals their occurrence to the processing module 48. For example, the comparator 46 may generate interrupts to be serviced by the processing module 48. The comparator 46 senses either a change in polarity of the voltage signal's waveform from positive to negative polarity ("negative zero crossing") or from negative to positive polarity ("positive zero crossing"). In some arrangements, the comparator 46 may identify only the positive zero crossings. Other configurations of the power analysis module 15 may identify only the negative zero crossings.

The galvanic isolator 50 acts to isolate the master controller 14 from the electrical charge of the power source 18. The galvanic isolator 50 may relay the series of pulses to the master controller 14. Although FIG. 2A illustrates an optocoupler, the galvanic isolator 50 may include other forms of galvanic isolation including, but not limited to, a capacitor, transformer, and/or wireless transmitter.

The processing module 48 may include an analog to digital (A/D) module 52, a core 54, a timing module 56, an output module 58, and a memory module 60. The memory module 60 may store digital values, voltage information, phase rotation information, voltage parameters, and timer information. The A/D module 52 samples the voltage signals and outputs digital values to the core 54 representing each phase's instantaneous voltage. In various implementations the A/D module 52 may multiplex multiple phases, sampling each one in turn. Alternatively, the A/D module 52 may be equipped to sample the phases in parallel.

Figure 4:
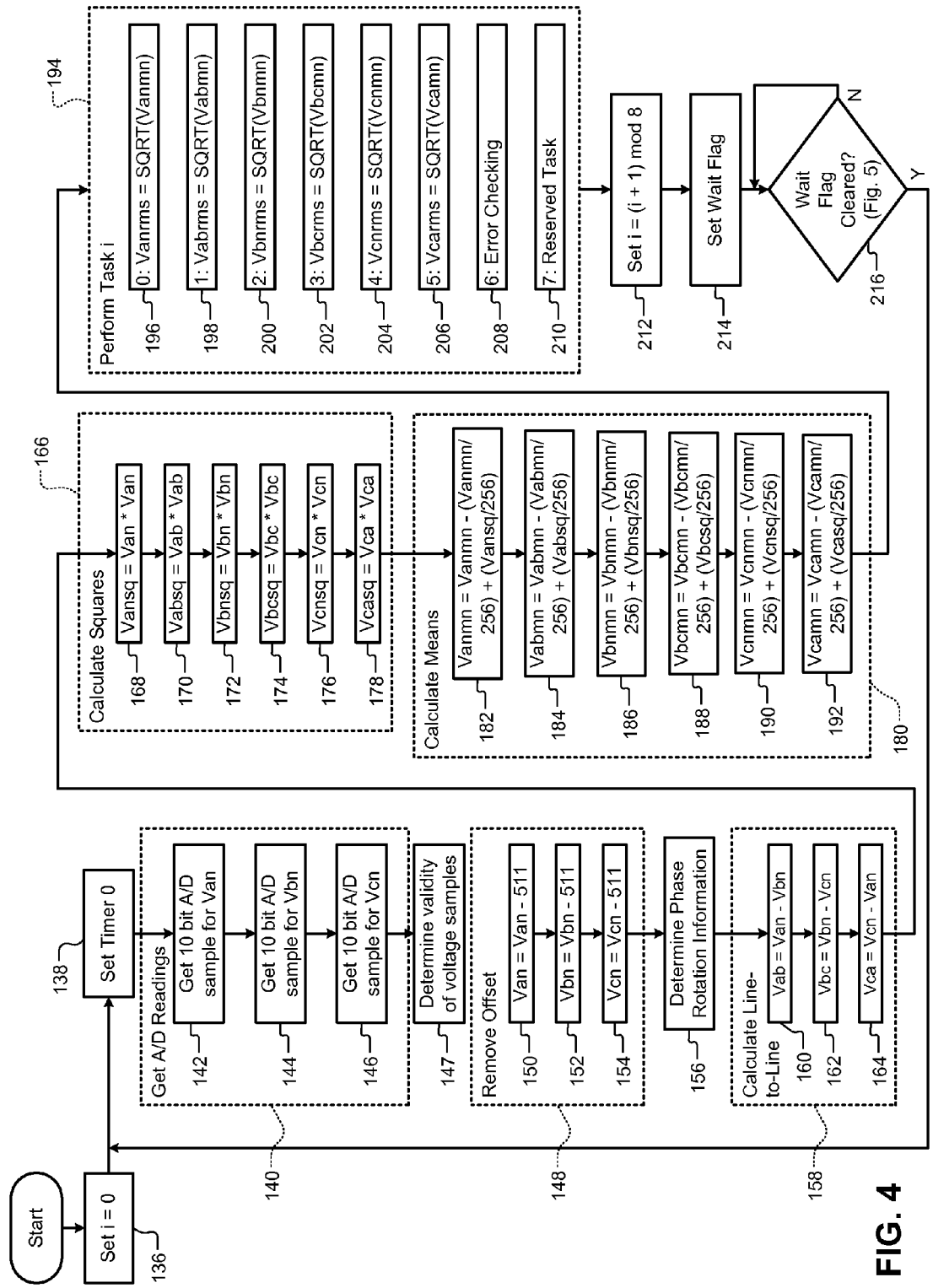
FIG. 4 is a flowchart detailing operation of a method of calculating voltage information by a power analysis module.
Figure 5:
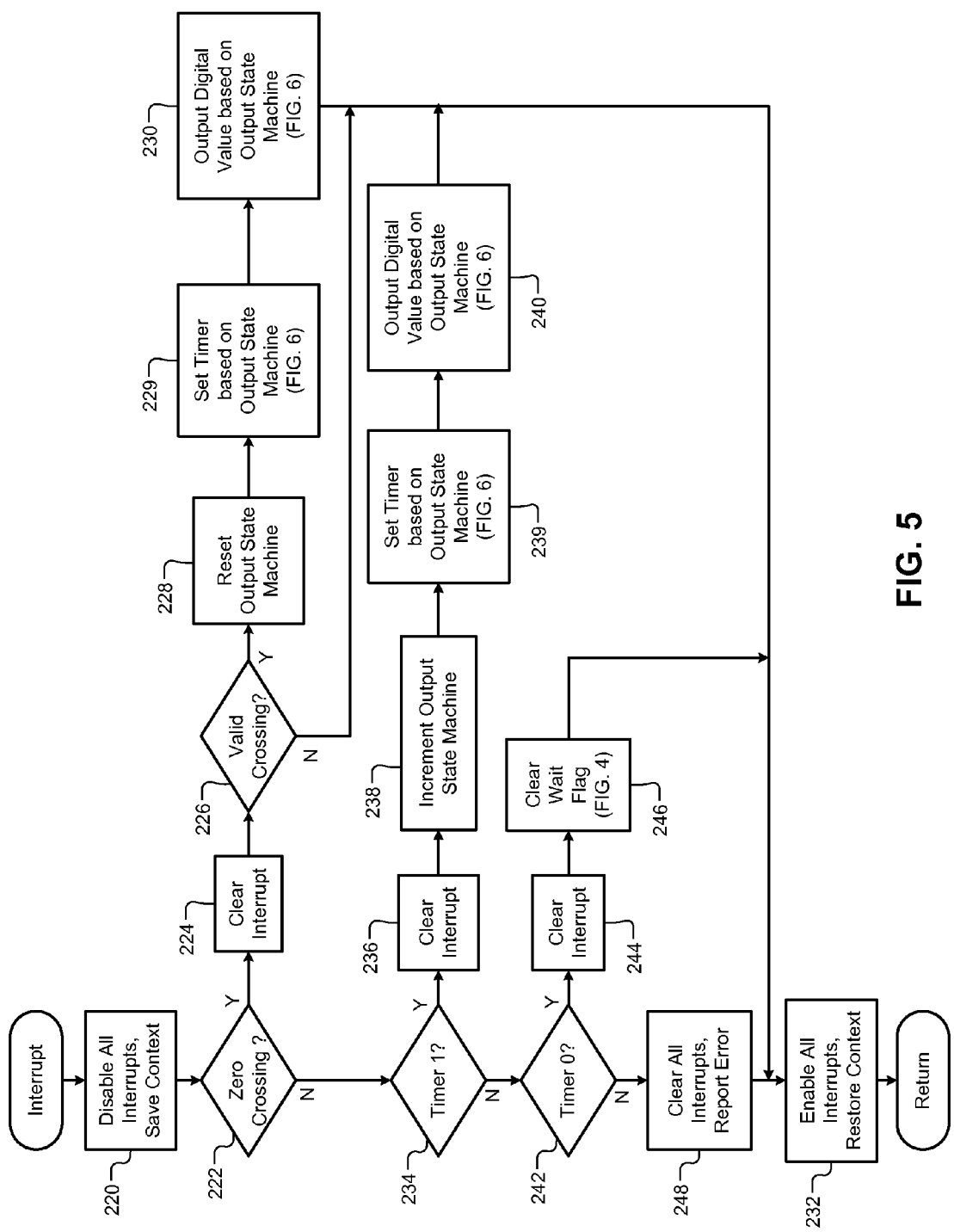
FIG. 5 is a flowchart detailing operation of a method of servicing interrupts generated by a power analysis module.

The core 54 supervises and controls the A/D module 52, the timing module 56, the comparator 46, the output module 58, and/or the memory module 60. The core 54 may receive comparator interrupts from the comparator 46, timer interrupts from the timing module 56, and digital values from the A/D module 52. As used herein, an interrupt is a signal indicating the need for attention by the core 54 or a need for a change in the execution of the logic operating on the core 54. The core 54 may use software in the form of one or more interrupt service routine(s) (ISR) and/or output state machines. The output state machine may be implemented in hardware of the core 54. The core 54 is configured to, among other things: (i) service interrupts (as shown in FIG. 5), (ii) retrieve digital values from the A/D module 52, (iii) calculate voltage information including voltage parameters (as shown in FIG. 4), (iv) determine phase rotation (as shown in FIG. 4), (v) determine voltage pulse and predetermined space lengths, (vi) load times into the timing module 56, (vii) store and retrieve voltage information, phase rotation, voltage pulse lengths, and predetermined space lengths into the memory module 60, and (viii) output the series of pulses to the output module 58.

The timing module 56 receives time intervals from the core 54 and sends timer interrupts back to the core 54 when the time intervals elapse. When any timer interval elapses, the timing module overflows and generates a timer interrupt. The core 54 may utilize the timing module 56 to time operations of the core 54 and/or to time the lengths of the sync pulses, voltage pulses, and predetermined spaces. In some arrangements, the timing module 56 may include (i) a timer one 62 ("timer 1") that is capable of receiving a first time interval and sending a timer one interrupt when timer one 62 overflows, and (ii) a timer zero 64 ("timer 0") that is capable of receiving a second time interval and sending a timer zero interrupt when timer zero 64 overflows.

The first and second time intervals may be the same or different amounts of time. For example, timer one 62 may receive the first time interval and timer zero 64 may receive the second time interval from the core 54. When the first interval has elapsed, timer one 62 may send the timer one interrupt to the core 54. Likewise, when the second time interval has elapsed, timer zero 64 may send the timer zero interrupt to the core 54. The timer one and timer zero interrupts may be serviced according to the logic of the core 54.

The output module 58 outputs the sync pulses, voltage pulses, and/or predetermined spaces to the galvanic isolator 50. The output module 58 receives pulse lengths and predetermined space lengths (i.e., both lengths represent the period of time for which the output module should be driven high or low) from the core 54. Based on these lengths, the output of the output module 58 is driven high or low to create sync pulse, voltage pulses, and/or predetermined spaces.

FIG. 2B illustrates another arrangement of the power analysis module 15. In this arrangement, a comparator 47 may be included within the processing module 48. The comparator may function similarly to the comparator 46 of FIG. 2A. The power supply 42 may include a transformer 43. The transformer 43 may galvanically isolate the power analysis module 15 from the electrical charge of the power source 18. The power analysis module 15 may further omit a galvanic isolator. In this arrangement, the output module 58 may output the series of pulses directly to the master controller 14 or to some other device.

FIG. 2C illustrates an implementation of the power analysis module 15 in which the output module 58 includes a compare/capture module 65 and timer one 62. The compare/capture module 65 includes a capture mode and a compare mode. In capture mode, the compare/capture module 65 captures the time in timer one 62 for each transition of the input state of the output module 58. In compare mode, the output of the output module 58 is driven high or low for the length of time equal to the time captured from timer one 62 and the compare/capture module 65 repeatedly compares the time captured from timer one 62 to the time the output of the output module 58 has been driven high or low. Once the period of time captured from timer one 62 is reached, the output of the output module 58 changes state and timer one 62 generates an interrupt to be serviced by the core 54. For FIG. 2B and 2C, it should be noted that the components 42, 44, 46, and 48 may perform the same functions within the power analysis modules 15 as previously described.

FIGS. 3A-3C present three examples of pulse series that may be output from the power analysis module 15. Each of the pulse series includes a sync pulse 88 and voltage pulses. The voltage pulses for FIGS. 3A, 3B, and 3C are collectively referred to with reference numerals 92, 104, 116, respectively. The intervals between the sync pulse 88 and the first voltage pulse, and between each of the voltage pulses, are referred to as spaces. The spaces for FIGS. 3A, 3B, and 3C are collectively referred to with reference numerals 128, 130, 132, respectively The sync pulse 88 indicates occurrence of a zero crossing event to the master controller 14 and/or indicates that voltage pulses are to be transmitted. The sync pulse 88 may have a predetermined length known to the master controller 14 that allows the master controller 14 to distinguish the sync pulse 88 from the voltage pulses. The lengths of the voltage pulses 92, 104, 116 convey voltage information about phases of the power source 18 to the master controller 14. Likewise, the lengths of the spaces 128, 130, 132 signify the number of phases and/or phase rotation of the power source 18 and/or the presence of voltage signals on Phase A.

The binary series of pulses are created by alternating the output of the output module 58 between low and high and/or high and low for finite periods of time. The sync pulse 88 and voltage pulses 92, 104, 116 are outputted as the same binary state (both either high or low). The predetermined spaces 128, 130, 132 have the opposite binary state as the sync pulse 88 and voltage pulses 92, 104, 116. The predetermined spaces are outputted between the voltage pulses 92, 104, 116 and between the sync pulse 88 and first voltage pulse in the series of pulses.

In one arrangement, the sync pulse 88 may be outputted upon each occurrence of a zero crossing event, such as a positive zero crossing, of Phase A. The initial edge of each sync pulse 88 (i.e., the rising edge when the sync pulse is active high and the falling edge when the sync pulse is active low) may occur approximately simultaneously with each zero crossing event. Approximately simultaneously may be understood to mean the amount of time it takes the power analysis module 15 to sense the zero crossing event, generate and service a corresponding interrupt, and begin to output the sync pulse 88. The master controller 14 may calculate the frequency of Phase A's voltage signal by counting the number of sync pulses 88 over a period of time. Furthermore, the master controller 14 may use the sync pulse 88 to synchronize the phase relationship of the power sources 18 and 20 such that the load 22 is supplied with the same phase when it is selectively coupled between the power sources 18 and 20.

The processing module 48 determines the voltage information based on voltage parameters. The voltage parameters include, for example, the digital values sampled by the ND module 52, the instantaneous line-to-neutral voltage, and digital values derived from the instantaneous line-to-neutral voltage values, such as the line-to-line voltage, the square of the line-to-neutral voltage, and/or the square of the line-to-line voltage. The voltage information may include phase rotation information, peak voltage, peak to peak voltage, and/or statistical parameters, such as the mean of the line-to-line voltage, the mean of the line-to-neutral voltage, the RMS of the line-to-line voltage, the RMS of the line-to-neutral voltage, and/or other statistical parameter determined from one or more of the voltage parameters.

In the pulse series depicted in FIGS. 3A-3C, the Van, Vbn, and Vcn voltage pulses indicate the line-to-neutral voltages of Phases A, B, and C, respectively. Similarly, the Vab, Vbc, and Vca pulses indicate the line-to-line voltages of Phases A, B, and C, respectively. The length of the voltage pulses 92, 104, 116 is determined based on the corresponding value of the voltage information, including the phase information, on which the voltage pulse is based. For example, the length of a voltage pulse may be directly proportional to the value of the corresponding voltage information. The ratio of length to voltage is known to both the power analysis module 15 and the master controller 14.

For example only, the ratio may be predetermined as 2 microseconds per volt. In such a case, the length of a voltage pulse for voltage information including a line-to-neutral voltage of 120 volts would be 240 microseconds long. After receiving a 240 microsecond voltage pulse, the master controller 14 determines the value of the voltage information to be 120 volts by dividing 240 microseconds by 2 microseconds per volt.

In some configurations, the power analysis module 15 may output the voltage pulses 92, 104, 116 in a predetermined order that is known to the master controller 14. The predetermined order of the voltage pulses 92, 104, 116 allows the master controller 14 to understand which item of the voltage information is being received. In one implementation, for example, the power analysis module 15 outputs the Van pulse based on the RMS line-to-neutral voltage of the phase A, followed by the Vab pulse based on the RMS line-to-line voltage between phases A and B. The master controller 14 understands that the first voltage pulse represents the RMS line-to-neutral voltage of the phase A and that the second voltage pulse represents the RMS line-to-line voltage between phases A and B because of the predetermined order.

The voltage pulses 92, 104, 116 may have minimum and/or maximum pulse lengths. The minimum voltage pulse length may be known to the master controller 14 and allows for (i) distinguishing the voltage pulses 92, 104, 116 from the sync pulse 88 and/or (ii) understanding that the voltage information is below a minimum threshold amount. The maximum voltage pulse length may be chosen to allow the power analysis module 15 to complete its output of the series of pulses before the voltage signal of Phase A completes one cycle.

In some configurations, the predetermined spaces 128, 130, or 132 have one of a set of predetermined lengths, known to the master controller 14, which allows the master controller 14 to determine phase information. Phase information includes phase information about of the power source 18, such as whether the power source 18 is single-phase or three-phase. The phase information may include, the phase rotation, such as ABC or CBA, for three-phase. One of the predetermined lengths of the predetermined spaces 128, 130, or 132 may signal that Phase A has lost power. In various implementations, the predetermined spaces in a given pulse series are all the same—e.g., the lengths of spaces 128-1 through 128-6 are the same, the lengths of spaces 130-1 through 130-6 are the same, and the lengths of spaces 132-1 through 132-6 are the same.

In implementations of the power analysis module 15 outputting phase information as at least one of the voltage pulses 92, 104, 116, the predetermined spaces 128, 130, or 132 have predetermined lengths long enough to allow the power analysis module 15 to start and stop each voltage pulse 92, 104, 116.

With reference to FIG. 3A, an example of a pulse series from the power analysis module 15 for a single-phase power source is illustrated. In this configuration, the power analysis module 15 outputs the sync pulse 88 followed by predetermined space 128-1. The predetermined spaces 128-1 through 128-6 have a predetermined length that indicates a single-phase power source to the master controller 14. The power analysis module 15 then outputs the Van voltage pulse 92-1 followed by the predetermined space 128-2; the Vab voltage pulse 92-2 followed by the predetermined space 128-3; the Vbn voltage pulse 92-3 followed by the predetermined space 128-4; the Vbc voltage pulse 92-4 followed by the predetermined space 128-5; the Vcn voltage pulse 92-5 followed by the predetermined space 128-6; and the Vca voltage pulse 92-6. The power analysis module 15 then returns the output to high. In this case, the Vab voltage pulse 92-2, the Vbn voltage pulse 92-3, and the Vbc voltage pulse 92-4 are set at the minimum voltage pulse length because the power analysis module 15 is monitoring a single-phase power source, and the voltages are therefore zero.

VVith reference to FIG. 3B, an example of a pulse series from the power analysis module 15 for a three-phase power source with phase rotation ABC is illustrated. In this configuration, the power analysis module 15 outputs the sync pulse 88 followed by predetermined space 130-1. The predetermined spaces 130-1 through 130-6 have a predetermined length that indicates a three-phase power source with phase rotation ABC to the master controller 14. The power analysis module 15 then outputs the Van voltage pulse 104-1 followed by the predetermined space 130-2; the Vab voltage pulse 104-2 followed by the predetermined space 130-3; the Vbn voltage pulse 104-3 followed by the predetermined space 130-4; the Vbc voltage pulse 104-4 followed by the predetermined space 130-5; the Vcn voltage pulse 104-5 followed by the predetermined space 130-6; and the Vca voltage pulse 104-6. The power analysis module 15 then returns the output to high.

With reference to FIG. 3C, an example of a pulse series from the power analysis module 15 for a three-phase power source with phase rotation CBA is illustrated. In this configuration, the power analysis module 15 outputs the sync pulse 88 followed by predetermined space 132-1. The predetermined spaces 132-1 through 132-6 have a predetermined length that indicates a three-phase power source with phase rotation CBA to the master controller 14. The power analysis module 15 then outputs the Van voltage pulse 116-1 followed by the predetermined space 132-2; the Vab voltage pulse 116-2 followed by the predetermined space 132-3; the Vbn voltage pulse 116-3 followed by the predetermined space 132-4; the Vbc voltage pulse 116-4 followed by the predetermined space 132-5; the Vcn voltage pulse 116-5 followed by the predetermined space 130-6; and the Vca voltage pulse 116-6 followed by the power analysis module 15 returning the output to high.

With reference to FIG. 4, an example of determining the voltage information, voltage and statistical parameters, and phase rotation information for each phase is illustrated. As used hereinafter, the term mainloop will be used to describe the method of determining the voltage information and phase rotation information for each phase. The core 54 starts the mainloop at 136, where the core 54 sets the task variable "i" to zero, and, at 138, the core 54 sets timer zero 64 based on a predetermined processing time of the mainloop. The predetermined processing time of the mainloop is chosen based on the voltage and frequency of the power sources 18 and based on the length of time necessary for the core 54 to complete the calculations required of mainloop. In one arrangement, the predetermined processing time of the main loop is chosen to be 800 microseconds.

At 140, the A/D module 52 takes voltage samples of each phase. The samples include the digital values representing the instantaneous voltage readings of each phase. Taking voltage samples of each phase includes taking a 10 bit digital sample of the line-to-neutral voltage of Phase A at 142, the line-to-neutral voltage of Phase B at 144, and/or the line-to-neutral voltage of Phase C at 146. It should be understood that the use of a 10 bit sampling size of the A/D module 52 is for illustrative purposes only.

At 147, the core 54 determines the validity of the voltage samples taken during 140. If the power source does not include a neutral conductor or the phases of the power source are out of balance, the line-to-neutral voltage samples are not valid and cannot be relied upon by the master controller 14. To determine whether the digital samples of the line-to-neutral values are valid, the core 54 employs software that determines whether the RMS voltage information of the line-to-neutral voltage for each phase, computed in 194, are within an acceptable range. If RMS voltage information is within the acceptable range, the power analysis module 15 will output the line-to-neutral voltage information as described herein. If RMS values are not within the acceptable range, the power analysis module 15 outputs the line-to-line voltage information voltage information but signals to the master controller 14 that the line-to-neutral voltage information cannot be relied upon. To signal to the master controller 14 that the line-to-neutral voltage information cannot be relied upon, the power analysis module 15 may output the minimum voltage pulse length for each line-to-neutral voltage pulse.

At 148, the core 54 removes the offset caused by the power supply of the processing module 48 from the digital samples taken at 140. Removing the offset includes subtracting the digital equivalent of the offset from (i) the Van digital sample at 150, (ii) the Vbn digital sample at 152, and/or (iii) the Vcn digital sample at 154. For example, in some configurations of the power analysis module 15, the power supply voltage is five (5) volts. Removing the power supply offset from the digital samples includes subtracting 511 (the digital equivalent of the midpoint of the power supply voltage of 2.5 volts) from each of the digital samples taken at 140.

At 156, the power analysis module 15 determines the phase rotation information of the power source 18. The core 54 employs software to determine the phase rotation information. For example, the core 54 may determine that the rotation is ABC when, after a positive zero crossing of Phase A, a positive zero crossing of Phase B occurs before a positive zero crossing of Phase C. Conversely, when after a positive zero crossing of Phase A, a positive zero crossing of Phase C occurs before a positive zero crossing of Phase B, the core may determine that the rotation is ACB (or, equivalently, CBA). The core 54 may store the values determined at 148 and/or 156 in the memory module 60.

At 158, the core 54 calculates the line-to-line voltages of the power source 18. Calculating the line-to-line voltages includes (i) calculating the line-to-line voltages between phase A and B at 160 by subtracting the Vbn digital sample from the Van digital sample, (ii) calculating the line-to-line voltages between phase B and C at 162 by subtracting the Vcn digital sample from the Vbn digital sample, and/or (iii) calculating the line-to-line voltages between phase C and A at 164 by subtracting the Van digital sample from the Vcn digital sample. The core 54 may store the values determined at 158 in the memory module 60.

At 166, the core 54 calculates the squares of line-to-neutral and line-to-line voltages determined in 148 and 158. Calculating the squares includes squaring Van ("Vansq") at 168, squaring Vab ("Vabsq") at 170, squaring Vbn ("Vbnsq") at 172, squaring Vbc ("Vbcsq") at 174, squaring Vcn ("Vcnsq") at 176, and squaring Vca ("Vcasq") at 178. The core 54 may store the values determined at 166 in the memory module 60.

At 180, the core 54 calculates the arithmetic mean of squares of the line-to-line and line-to-neutral voltages using the square values calculated at 166 and the arithmetic means calculated in the previous iteration of the mainloop. Calculating the mean of line-to-line and line-to-neutral voltages may include calculating the mean of the square of Van ("Vanmn") at 182, the mean of the square of Vab ("Vabmn") at 184, the mean of the square of Vbn ("Vbnmn") at 186, the mean of the square of Vbc ("Vbcmn") at 188, the mean of the square of Vcn ("Vcnmn") at 190, and/or the mean of the square of Vca ("Vcamn") at 192. The power analysis module 15 may store the values determined at 180 in the memory module 60.

In the implementation of the mainloop illustrated of FIG. 4, the core 54 calculates the mean values by retrieving the mean from the previous iteration mainloop ("previous mean") from the memory module 60, subtracting the previous mean divided by 256 from the previous mean and adding the corresponding square value calculated in 166 divided by 256. This allows the mean to approximate a mean of the past 256 iterations of the main loop, where each new square value contributes to the mean as if 256 values were stored, without the storage and processing overhead of storing the last 256 values.

At 194, the core 54 performs task "i". The task the core 54 performs at 194 depends on the value of the task variable "i". When i=0, the core 54 calculates the RMS of Van ("Vanrms") at 196, which includes taking the square root of the Vanmn value from 182. When i=1, the core 54 calculates the RMS of Vab ("Vabrms") at 198, which includes taking the square root of the Vabmn value from 184. When i=2, the core 54 calculates the RMS of Vbn ("Vbnrms") at 200, which includes taking the square root of the Vbnmn value from 186. When i=3, the core 54 calculates the RMS of Vbc ("Vbcrms") at 202, which includes taking the square root of the Vabmn value from 188. When i=4, the core 54 calculates the RMS of Vcn ("Vcnrms") at 204, which includes taking the square root of the Vabmn value from 190. When i=5, the core 54 calculates the RMS of Vca ("Vcarms") at 206, which may include taking the square root of the Vabmn value from 192.

When i=6, the core 54 performs an error check. The error check may include checking for errors in any of the voltage information calculations performed at 148, 158, 166, 180, and/or 194. When i=7, the power analysis module 15 performs a reserved task, which may include any task inputted into the power analysis module 15. In some configurations, the error checking performed at 208 and the reserve task performed at 210 may be eliminated to decrease the time required to perform the main loop. It should be understood that the operations assigned to values of the task variable "i" is for illustrative purposes only, and any task variable could be assigned to any operations in 196-210. Furthermore, the mainloop could have more than or fewer than eight tasks performed at 194.

At 212, the core 54 increments task variable Task variable may progressively increase from zero (0) to seven (7) and may reset to zero (0) after i=7. At 214, the core 54 sets the wait flag and continues to 216. The core 54 remains at 216 until the wait flag is cleared. An interrupt caused by timer zero 64 expiring may clear the wait flag, as shown in FIG. 5. Once the wait flag has been cleared, control returns to 138.

With reference to FIG. 5, a method of servicing interrupts generated by the processing module 48 is illustrated. Control begins when an interrupt is received. For example, the interrupt may be an interrupt corresponding to the comparator 46, an interrupt corresponding to timer one 62, and/or an interrupt corresponding to timer zero 64.

At 220, the core 54 disables all interrupts and saves context information to the memory module 60. At 222, the core 54 determines whether there has been a positive zero crossing event. In various implementations, the comparator 46 only generates an interrupt upon the occurrence of a positive zero crossing event of Phase A, and the core 54 determines that the positive zero crossing has occurred when the core 54 receives the comparator 46 interrupt. If the core 54 receives the comparator interrupt, the core 54 clears the comparator interrupt at 224 and determines whether the zero crossing event was valid at 226. The core 54 determines whether the zero crossing is valid by checking the polarity of the previous several A/D samples taken by the A/D module 52 on Phase A. If the previous A/D samples are positive, the zero crossing event may be spurious, and the core 54 may declare the zero crossing to not be valid.

If the core 54 determines that the zero crossing is valid, the core 54 resets the output state machine at 228. At 229, the core 54 sets timer one 62 based on the current state of the output state machine (see FIG. 6), and at 230 the core 54 outputs a digital value to the output module 58 based on the current state of the output state machine. The core 54 then enables all interrupts and restores the previous context at 232. If the core 54 determines that the zero crossing is not valid at 226, the core 54 ignores the comparator interrupt, enables all interrupts, and restores its context at 232.

If, at 222, the core 54 determines no zero crossing has occurred, the core 54 determines whether timer one 62 has overflowed at 234. The core 54 determines that timer one 62 has overflowed when it receives the timer one interrupt. If the timer one interrupt has been received, the core 54 clears the timer one interrupt at 236 and increments the output state machine of FIG. 6 at 238. At 239, the core 54 sets timer one 62 based on the state of the output state machine and, at 240, outputs a digital value to the output module 58 based on the output value of the output state machine. The core 54 then enables all interrupts and restores the previous context at 232.

If, at 234, timer one 62 has not overflowed, the core 54 determines whether timer zero 64 has overflowed. At 242, the core 54 determines that timer zero 64 has overflowed when a timer zero interrupt is received. If the core 54 receives a timer zero interrupt, the core 54 clears the timer zero interrupt at 244 and clears the wait flag at 246. As described in FIG. 4, clearing the wait flag at 246 allows the processing module 48 to perform another mainloop for determining the voltage information. The duration of timer zero determines how often voltage information is updated.

If there has been no zero crossing event at 222, timer one 62 has not overflowed at 234, and timer zero 64 has not overflowed at 242, an unexpected interrupt may have occurred. The core 54 therefore reports an error at 248 and clears all interrupts. At 232, the core 54 enables all interrupts, restores the previous context at 232, and returns to previously executing code, such as the mainloop of FIG. 4. Because of the order of the decisions in FIG. 5, servicing of the comparator interrupt has priority over the timer one interrupt, which has priority over the timer zero interrupt. In various implementations, the core 54 may repeatedly perform the interrupt handling of FIG. 5 until no outstanding interrupts are present.

Figure 6:
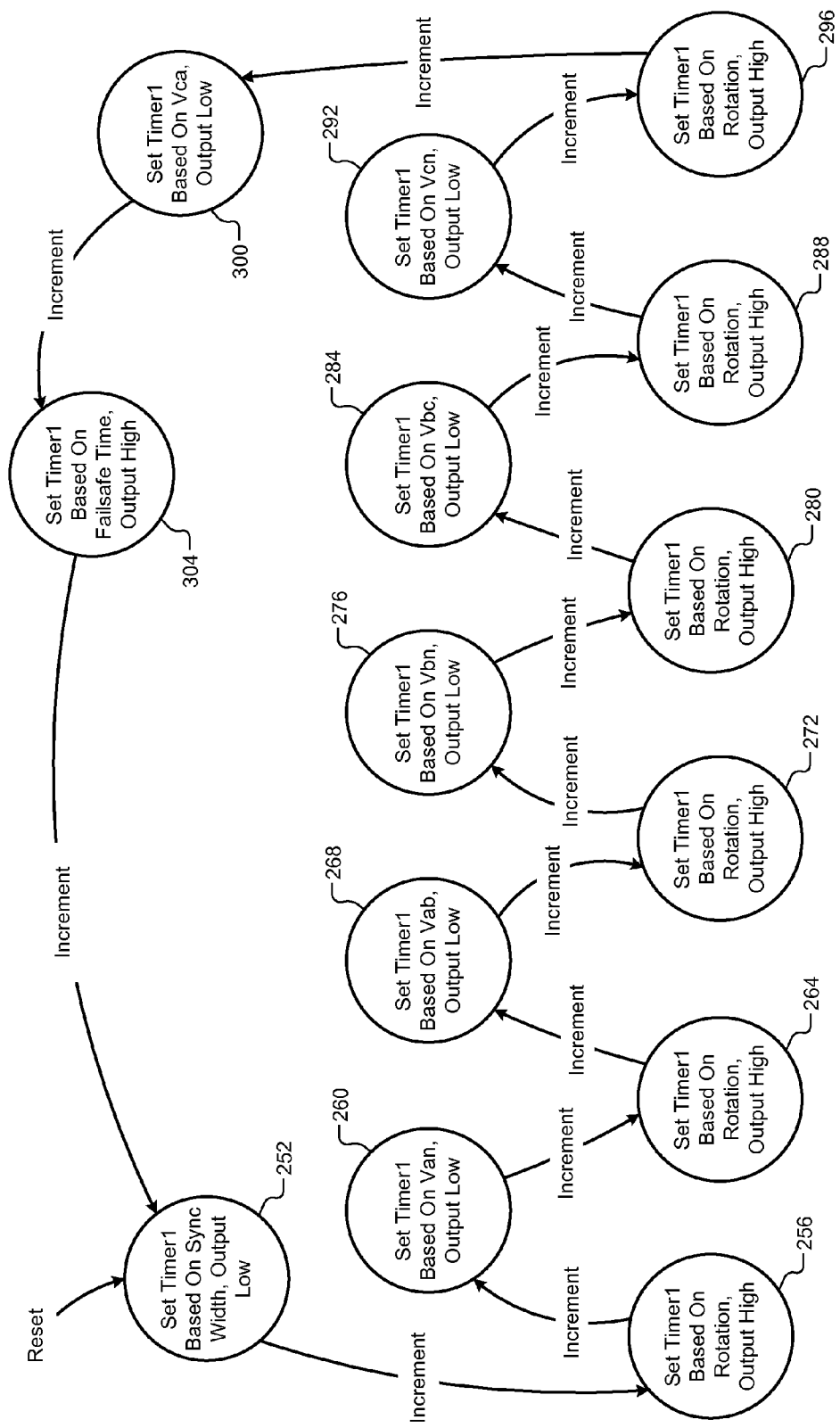
FIG. 6 is a representation of an output state machine for controlling output.

FIG. 6 illustrates an example of an output state machine for the power analysis module 15. State 252 is the reset state, and a reset may be commanded by 228 of FIG. 5. State 252 specifies that timer one is set based on the sync pulse length, and specifies a low output. Although the present disclosure describes an active low convention, the principles of the present disclosure also apply to an active high convention. State 252 therefore provides the timer and output value information used by 229 and 230 of FIG. 5. The low output corresponds to the beginning of the sync pulse 88. The value set in timer one determines when another interrupt will be generated and the output will return to high, ending the sync pulse 88.

When the state machine is incremented, state 256 is selected. The state machine is incremented upon expiration of timer one (signaled by a corresponding interrupt) by 238 of FIG. 5. State 256 specifies a high output and a timer one value based on phase rotation. When the high output is effectuated by 240 of FIG. 5, the sync pulse 88 ends. The interval until the first voltage pulse is a space, and the length of the space is selected from a set of predetermined values. One of the values corresponds to a sensed phase rotation ABC, while another one of the values corresponds to a sensed phase rotation CBA, and yet another one of the values corresponds to a single-phase power source being sensed.

When the state machine is next incremented, state 260 is selected. State 260 specifies a low output, and a timer one value based on a length proportional to the Van voltage. When the low output is effectuated, the Van voltage pulse begins.

When timer one, which was set based on the length of Van, expires, the state machine is incremented, to state 264. State 264 specifies a high output and sets the timer based on the selected predetermined space length. When the high output is effectuated, the Van voltage pulse is thereby stopped.

Further incrementing of the state machine progresses, in order, through states 268, 272, 276, 280, 284, 288, 292, 296, 300, and 304. States 260, 268, 276, 284, 292, and 300 correspond to the beginnings of voltage pulses, while states 264, 272, 280, 288, 296, and 304 correspond to the ends of those voltage pulses.

State 304 specifies that timer one be set based on a failsafe time. The failsafe time may be longer than one cycle of a valid power source signal. When the power source is operating normally, a positive zero crossing will occur before the failsafe time expires in timer one, and the interrupt for the positive zero crossing will reset the state machine to 252. However, if the failsafe time expires in timer one, such as when Phase A of the power source disappears, the state machine will increment to state 252, where transmitting of a new pulse series will begin. The failsafe time ensures that pulse series are sent on a regular basis even if the power source is not functioning correctly.

The foregoing description of the arrangements has been provided for purposes of illustration and description. It is not intended to be exhaustive or to limit the disclosure. Individual elements or features of a particular arrangement are generally not limited to that particular arrangement, but, where applicable, are interchangeable and can be used in a selected arrangement, even if not specifically shown or described. The same may also be varied in many ways. Such variations are not to be regarded as a departure from the disclosure, and all such modifications are intended to be included within the scope of the disclosure.

What is claimed is:

1. A method comprising:
   receiving a power source having at least one phase;
   sensing voltage signals of each phase of the at least one phase;
   detecting a zero crossing event of a selected phase of the at least one phase based on the sensed voltage signals of the selected phase;
   determining, using a processor, voltage information for each phase of the at least one phase based on the corresponding sensed voltage signals, wherein the voltage information for each phase represents a voltage magnitude of the phase;
   in response to the zero crossing event, only outputting information via a single galvanic isolator, wherein the outputting information includes outputting a series of pulses, wherein respective lengths of some or all of the pulses in the series convey the corresponding voltage information for each phase of the at least one phase, and wherein the series of pulses includes a sync pulse representative of the zero crossing event; and
   beginning outputting the sync pulse approximately simultaneously with the zero crossing event, wherein the sync pulse is an initial pulse of the series of pulses.

2. The method of claim 1 further comprising:
   receiving the power source and a second power source in an automatic transfer switch;
   receiving the series of pulses from the galvanic isolator;
   based on the received series of pulses, selecting one of the power source and the second power source; and
   connecting the selected power source to a load.

3. The method of claim 1 wherein the at least one phase includes three phases, the method further comprising determining a phase rotation of the three phases.

4. The method of claim 3 further comprising:
   selecting a predetermined spacing based on the phase rotation; and
   outputting the series of pulses with the predetermined spacing between at least two pulses of the series of pulses.

5. The method of claim 1 wherein the series of pulses includes, for each of the at least one phase, at least one voltage pulse representative of corresponding voltage information.

6. The method of claim 1 wherein the at least one phase includes three phases and wherein outputting the series of pulses includes outputting a voltage pulse corresponding to each of the three phases.

7. The method of claim 1 wherein the voltage signals for a first phase of the at least one phase include instantaneous voltage readings, and wherein the determining the voltage information for the first phase includes detecting a peak value of the instantaneous voltage readings.

8. The method of claim 1 wherein the voltage signals for a first phase of the at least one phase includes instantaneous voltage readings, and wherein the determining the voltage information for the first phase includes calculating a statistical parameter of the first phase based on the instantaneous voltage readings.

9. The method of claim 8 wherein the statistical parameter includes at least one of a mean value, a root mean value, and a root mean squared value.

10. The method of claim 1 wherein the determining the voltage information for each of the at least one phase includes determining at least one of a peak voltage, peak to peak voltage, phase information, line-to-line voltage, a line-to-neutral voltage, a square of the line-to-line voltage, a square of the line-to-neutral voltage, a mean of the line-to-line voltage, a mean of the line-to-neutral voltage, a root mean square of the line-to-line voltage, and a root mean square of the line-to-neutral voltage.

11. The method of claim 1 wherein:
   the determining the voltage information includes determining, for each one of the at least one phase:
      a first voltage parameter representing a line-to-neutral voltage and a second voltage parameter representing a line-to-line voltage; and
      a root mean square of at least one of the first and second voltage parameters; and
   the series of pulses includes, for each of the at least one phase, a voltage pulse representative of the root mean square.

12. The method of claim 11 wherein the at least one phase includes three phases, the method further comprising:
   determining a phase rotation of the three phases;
   selecting a predetermined spacing based on the phase rotation; and
   outputting the series of pulses with the predetermined spacing between at least two of the pulses in the series.

13. The method of claim 12 further comprising outputting the series of pulses such that
   each of the voltage pulses is separated by the predetermined spacing.

14. The method of claim 1 wherein, for each phase of the at least one phase, (i) the voltage information includes a single value indicative of the voltage magnitude between two zero crossing events, and
(ii) the series of pulses includes a pulse for representing the single value.

15. The method of claim 1 wherein a length of the sync pulse is a fixed predetermined length.

16. A power analysis module receiving a power source having at least one phase, the power analysis module comprising:
a sensing module that senses voltage signals of each phase of the at least one phase;
a zero crossing module that detects a zero crossing event of a selected phase of the at least one phase based on the sensed voltage signals of the selected phase;
a processing module that determines voltage information for each phase of the at least one phase based on the corresponding sensed voltage signals, wherein the voltage information for each phase represents a voltage magnitude of the phase; and
an output module that, in response to the zero crossing event, only outputs information via a single galvanic isolator, wherein:
the output module outputs information by transmitting a series of pulses, respective lengths of some or all of the pulses in the series convey the voltage information for each phase of the at least one phase,
the series of pulses includes a sync pulse corresponding to the zero crossing event, and
the output module begins the series of pulses with the sync pulse such that the sync pulse begins approximately simultaneous with the zero crossing event.

17. The power analysis module of claim 16 wherein each of the lengths is proportional to the corresponding voltage information.

18. The power analysis module of claim 17 wherein a length of the sync pulse is a fixed predetermined length.

19. The power analysis module of claim 16 wherein:
the at least one phase includes three phases;
the processing module determines a phase rotation of the three phases and selects a predetermined spacing based on the phase rotation;
and the output module outputs the series of pulses with the predetermined spacing between at least two pulses of the series of pulses.

20. The power analysis module of claim 16 further comprising a processor that implements the processing module, wherein the zero crossing module includes a comparator that detects the zero crossing event of the selected phase, and wherein the comparator is external to the processor.

21. The power analysis module of claim 16 wherein the voltage information includes at least one of a peak voltage, peak to peak voltage, phase information, line-to-line voltage, a line-to-neutral voltage, a square of the line-to-line voltage, a square of the line-to-neutral voltage, a mean of the line-to-line voltage, a mean of the line-to-neutral voltage, a root mean square of the line-to-line voltage, and a root mean square of the line-to-neutral voltage.

22. The power analysis module of claim 16 wherein the series of pulses includes at least one voltage pulse representative of the voltage information.

23. An automatic transfer switch comprising:
the power analysis module of claim 16; and
a controller that (i) selects one of the power source and a second power source based on the series of pulses and (ii) couples the selected power source to a load.

24. The power analysis module of claim 16 wherein, for each phase of the at least one phase, (i) the voltage information includes a single value indicative of the voltage magnitude between two zero crossing events, and (ii) the series of pulses includes a pulse for representing the single value.

* * * * *